United States Patent
Aue

(10) Patent No.: US 8,074,120 B2
(45) Date of Patent: Dec. 6, 2011

(54) METHOD FOR RECOGNIZING A POWER FAILURE IN A DATA MEMORY AND RECOVERING THE DATA MEMORY

(75) Inventor: Axel Aue, Korntal (DE)

(73) Assignee: Robert Bosch GmbH, Stuttgart (DE)

( * ) Notice: Subject to any disclaimer, the term of this patent is extended or adjusted under 35 U.S.C. 154(b) by 149 days.

(21) Appl. No.: 12/097,324

(22) PCT Filed: Dec. 12, 2006

(86) PCT No.: PCT/EP2006/069576
§ 371 (c)(1),
(2), (4) Date: Nov. 6, 2008

(87) PCT Pub. No.: WO2007/071590
PCT Pub. Date: Jun. 28, 2007

(65) Prior Publication Data
US 2009/0158089 A1    Jun. 18, 2009

(30) Foreign Application Priority Data
Dec. 20, 2005   (DE) .......................... 10 2005 060 901

(51) Int. Cl.
*G06F 11/00*     (2006.01)
(52) U.S. Cl. ........................................ 714/48
(58) Field of Classification Search ................... 714/15, 714/48
See application file for complete search history.

(56) References Cited

U.S. PATENT DOCUMENTS

| | | | | |
|---|---|---|---|---|
| 4,698,808 A | * | 10/1987 | Ishii | 714/722 |
| 4,763,333 A | | 8/1988 | Byrd | |
| 5,123,017 A | * | 6/1992 | Simpkins et al. | 714/26 |
| 5,228,046 A | * | 7/1993 | Blake et al. | 714/761 |
| 5,708,589 A | * | 1/1998 | Beauvais | 700/293 |
| 6,128,243 A | * | 10/2000 | Chan et al. | 365/227 |
| 6,515,975 B1 | * | 2/2003 | Chheda et al. | 370/332 |
| 7,283,070 B1 | * | 10/2007 | Roy et al. | 341/67 |
| 2002/0044094 A1 | * | 4/2002 | May | 343/703 |

(Continued)

FOREIGN PATENT DOCUMENTS
EP          0256815          2/1988
(Continued)

OTHER PUBLICATIONS

International Search Report, PCT International Patent Application No. PCT/EP2006/069576 dated Mar. 26, 2007.

*Primary Examiner* — Scott Baderman
*Assistant Examiner* — Yair Leibovich
(74) *Attorney, Agent, or Firm* — Kenyon & Kenyon LLP

(57) ABSTRACT

To detect a power failure in a volatile data memory containing useful data units and test data units associated with the useful data units, the associated test data unit is also read when the useful data unit is read-accessed, and a decision is made as to whether the useful data unit is corrupted based on the test data unit. A power failure is identified when at least two read useful data units within a predefined number of successive read accesses are found to be corrupted.

10 Claims, 2 Drawing Sheets

U.S. PATENT DOCUMENTS

| | | |
|---|---|---|
| 2002/0199054 A1 | 12/2002 | Akahane et al. |
| 2003/0189493 A1* | 10/2003 | Klausner et al. ............. 340/575 |
| 2004/0030803 A1* | 2/2004 | Eatherton et al. ............. 709/245 |
| 2004/0103238 A1* | 5/2004 | Avraham et al. ............. 711/102 |
| 2005/0258860 A1* | 11/2005 | Satou et al. ..................... 326/30 |
| 2007/0192597 A1* | 8/2007 | Bade et al. .................... 713/167 |
| 2007/0222630 A1* | 9/2007 | Sugama et al. ............... 340/661 |
| 2008/0270830 A1* | 10/2008 | Weiberle et al. ................ 714/15 |
| 2009/0225087 A1* | 9/2009 | Herbrich et al. ............... 345/474 |

FOREIGN PATENT DOCUMENTS

| | | |
|---|---|---|
| JP | 61-141056 | 6/1986 |
| JP | 64-88665 | 4/1989 |
| JP | 2002-351685 | 12/2002 |

* cited by examiner

METHOD FOR RECOGNIZING A POWER FAILURE IN A DATA MEMORY AND RECOVERING THE DATA MEMORY

FIELD OF THE INVENTION

The present invention relates to a method for detecting a power failure in a volatile data memory and recovering the contents of such a memory in the event that a power failure is identified. Such a method may be used for any type of volatile data memory; one preferred field of application is data memories of programmed control units, in particular for automotive applications.

BACKGROUND INFORMATION

Modern control units of this type frequently operate via adaptive algorithms, whose parameters are individually adapted over time to the machine, for example the engine of a motor vehicle, to be controlled. For this purpose the control unit must be able to store the parameters for these algorithms which are optimized over time. EEPROMs or SRAMs in particular are used as memories for such data. SRAMs (statically buffered RAM) are primarily used due to the long write times required for EEPROMs.

In order to retain their data content, SRAMs require a continuously applied supply voltage. Following an outage of the supply voltage the contents of these memories may become corrupted, and control based on the corrupted parameters is no longer able to provide accurate results. It is therefore desirable to be able to reliably recognize a power failure in order to prevent the use of parameters whose accuracy can no longer be guaranteed.

Various methods have been provided for detecting a power failure. A first approach is the direct, continuous monitoring of the supply voltage by comparing it to a minimum voltage which is possibly dependent on the type of data memory used and if the voltage is less than this minimum voltage it may be assumed that a loss has occurred, or at least it may be assumed with a high degree of probability that the data are corrupt. However, such monitoring is possible only when the circuit itself, which is used for the monitoring, still reliably functions at the minimum voltage. For voltages of 1.5 V and less in modern controllers, this requirement cannot be easily met.

Further approaches for recognizing a power failure are based on indirect detection based on memory contents corrupted as the result of a power failure. Thus, for example, check sums of the memory contents computed at different points in time may be compared to one another in order to draw a conclusion, based on a deviation between the check sums, concerning a power failure between the two points in time. However, the check sum computation is time-intensive, which is particularly burdensome when the computation delays startup of the machine controlled by the control unit.

According to a further approach, predetermined test patterns are stored in a designated area of the memory, from time to time they are compared with the setpoint value, and in the event of a deviation from the setpoint value a power failure is identified. A disadvantage of this approach, however, is that the memory area used for the test patterns is not available for other purposes. In addition, there is the risk that various cells in the memory to be monitored may have different periods of tolerance for power failures. As long as there is a lack of certainty that the memory cells containing the test patterns are the ones most sensitive to a power failure, the integrity of the test pattern cannot be used to support a definitive conclusion that no power failure has occurred.

The trend toward miniaturization of the circuit structures of modern semiconductor memories has resulted in increased sensitivity to ionizing radiation. This radiation may be of cosmic origin in particular, but may also result from radioactive decay in the solder or the housing of the semiconductor circuit. The charge quantities which account for the difference between two different logical levels of a modern highly integrated circuit have become so small that a single quantum of ionizing radiation that is absorbed by a semiconductor structure may be sufficient to invert the logical state of the semiconductor. To enable detection of and response to such spontaneous state transitions, also referred to as "bit flip," a parity bit may be associated with a data word in such a memory, the parity bit being read together with the data word. A discrepancy between the parity of the read data word and the associated read parity bit indicates a bit flip.

As the resolution of semiconductor structures becomes increasingly finer, the higher is the probability that an observed parity error is radiation-induced, so that, based on the occurrence of such a parity error, it is not possible to definitively conclude that a power failure has occurred.

SUMMARY

In accordance with an example embodiment of the present invention, a method is provided for detecting a power failure which may be performed in a short time, and which when carried out has little or no adverse effect on the processing power of a processor accessing the monitored data memory, and which may be implemented at minimal cost. Circuit components are no longer required for carrying out the method, since these are necessary anyway for recognizing radiation-induced bit flips. Because the useful data units which the method accesses are arbitrary, it is not necessary for any given useful data units to be read specifically for the purposes of the method according to the present invention, and instead, reading processes may be used which are performed within the scope of carrying out various given tasks by the method according to the present invention. Therefore, the method does not delay the processing of such a task.

The method makes use of the fact that the radiation-induced bit flips occur at random times with no correlation to one another. The time periods between two successive radiation-induced bit flips therefore have an exponential distribution. The probability of detecting one or more additional bit flips after detection of a first bit flip in a predetermined time period or in the course of a predetermined number of successive read accesses in this time period may be made arbitrarily small by an appropriate selection of the time period or the number of read accesses. If a useful data unit that is read is nevertheless found to be corrupted in the predetermined number of read accesses, the probability that this is due to ionizing radiation is likewise arbitrarily low, and it may thus be assumed that such an error frequency is not radiation-induced, but instead has been caused by a power failure.

In the simplest case, the test data unit used for identifying corrupted data may be a parity bit which is associated with each useful data unit. The test data unit associated with a useful data unit may be obtained from the useful data unit, using an error correction coding method known as Reed-Solomon or Hamming coding, for example, in such a way that for moderate corruption of the useful data unit the test data unit allows the useful data unit to be corrected. Such a correction may be meaningful in particular if the finding that a useful data unit is corrupted does not also directly result in identification of a power failure.

When a power failure has been detected according to the above-described procedure, it is preferable to discard not only the useful data units which have been directly found to be corrupted, but also the useful data units from at least a portion of the volatile data memory. One reason for this is that in such a case, unlike the situation for a radiation-induced bit flip, there is a high probability of multiple bit errors in the same useful data unit. If processing is performed using the data which are no longer reliable, there is a risk that an existing error may not be detected during reading, and operations may be carried out unknowingly using corrupted data.

In particular, useful data units derived from measured data obtained in an iterative control process may be easily recovered by a recomputation based on instantaneously measured data.

Data for which quick recovery based on measured data is possible only with great difficulty, either because the data contain constant parameters of the system carrying out the method or because the data are the result of a long optimization process, are preferably recovered, at least in part, by transfer from a nonvolatile memory. Useful data units to be optimized over a long period may thus be transferred to a nonvolatile memory, for example, in each case before switching off the control unit or at another predetermined time, and the useful data units may be recovered at a later time by transferring them from the nonvolatile memory.

As discussed above, in the event of a power failure there is a high probability that useful data units, which in the course of the method have not been tested for corruption or in which no corruption was found after such a test, may nevertheless be corrupted. For this reason, when a power failure is detected it is practical to also recover useful data units which have not been found to be corrupted; however, in the case of a radiation-induced bit flip such a measure does not result in any benefits.

The recovered useful data units within the scope of the method may also include useful data units with which no test data are associated.

BRIEF DESCRIPTION OF THE DRAWINGS

Further features and advantages of the present invention are described below, with reference to the figures.

DETAILED DESCRIPTION OF EXAMPLE EMBODIMENTS

Figure 1:
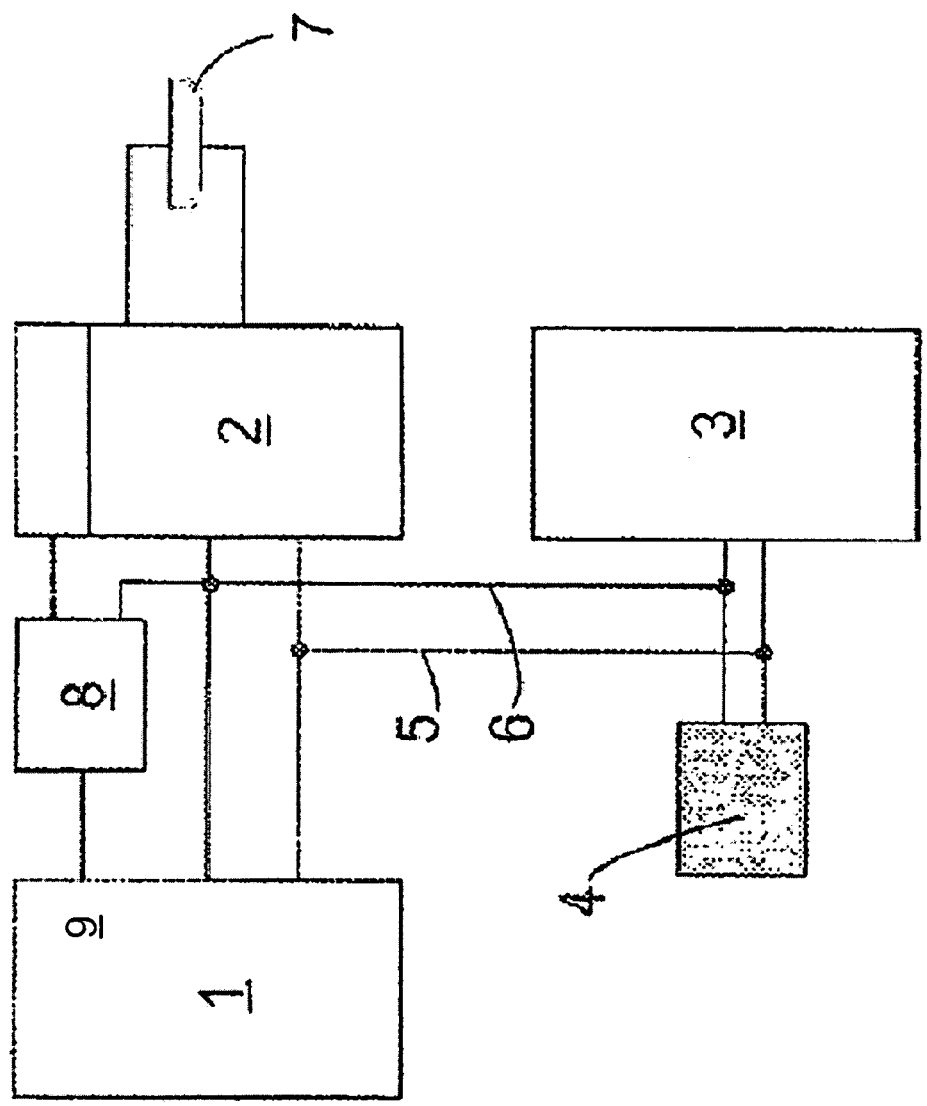
FIG. 1 shows a block diagram of a system having a control unit and a controlled machine, for which the method according to the present invention may be used.

The control unit schematically illustrated in FIG. 1 includes a microprocessor 1, an SRAM 2, a read-only memory or ROM 3, and multiple sensors and actuators, connected to the machine denoted by reference numeral 4, which communicate with one another via an address bus 5 and a data bus 6. Additional components such as a dynamic working memory may be present, but are not illustrated in the figure since they are not essential for understanding the present invention.

SRAM 2 receives an operating voltage from a power source 7 under interference-free conditions, even when microprocessor 1 and machine 4 are switched off, with the result that parameter values stored in SRAM 2 are also retained in the switched-off state. SRAM 2 is divided into memory cells, each containing one data word having a width corresponding to the width of data bus 6 and containing one parity bit. Connected to data bus 6 is a parity circuit 8 which during a write process into SRAM 2 generates a parity bit for the data word present on data bus 6, and transmits same to SRAM 2, thus storing therein the data word together with its parity bit. Conversely, during a read process, parity circuit 8 receives from SRAM 2 the parity bit stored there with the read data word and compares this parity bit to a parity bit computed from the data word outputted on data bus 6. If the parity bits match, the data word is accepted as error-free. If the parity bits do not match, parity circuit 8 sends a warning signal to microprocessor 1, in particular to an interrupt input 9 of microprocessor 1.

Figure 2:
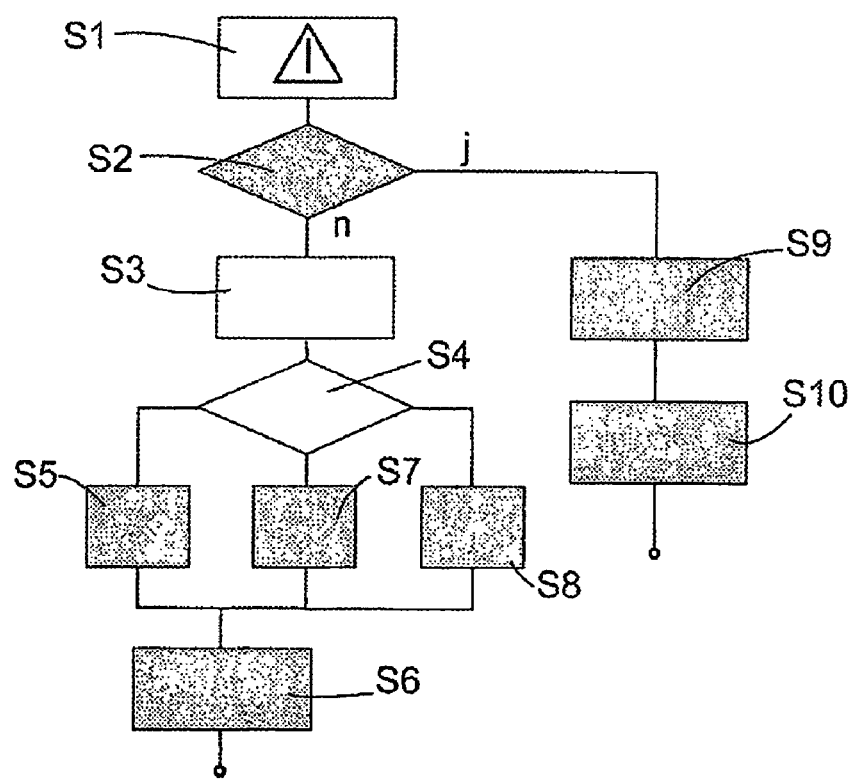
FIG. 2 shows a flow chart of one exemplary embodiment of the method according to the present invention.

FIG. 2 shows in the form of a flow chart one exemplary embodiment of a method which may be carried out by microprocessor 1 upon receipt of the warning signal. The step of receiving the warning signal is denoted by reference numeral S1. This step is followed by a step S2 in which a check is made as to whether a timer is set. The timer may be a circuit implemented outside microprocessor 1; however, it may also be a register in microprocessor 1 or an external memory location which is considered to be set as long as its content is different from "=," and its content is routinely decremented, for example controlled by a clock signal which also controls microprocessor 1 or upon each access of SRAM 2 by the microprocessor, until the register or external memory location reaches the value 0.

First, the case is considered in which the timer has been found to be not set. In this case the method branches to step S3, in which the memory cell whose error triggered the warning signal is identified. Based on a predefined table, in step S4 a decision is made as to which of several possible classes the faulty memory cell belongs. The classes reflect the technical importance of the variables stored in the affected memory cell. One of these classes includes, for example, variables which during normal, undisturbed operation of microprocessor 1 are recomputed in short cycles based on signals from the sensors mounted on the machine. For such a variable an incorrect value may be accepted for a short time; in S5 treatment of the memory error may therefore be limited to writing into the memory cell a fixed, predetermined value which is usable but which does not necessarily have to allow optimal control of the machine, followed by setting of the timer in step S6 and return to normal operation.

A further class of variables is represented by characteristics maps which contain multiple parameterized values which are numerically similar. In this case, error elimination may be based on reading values in Step S7 of the characteristic curve for parameter values adjacent to those of the value stored in the faulty memory cell, and computing a value, which has a high probability of being close to the lost value, by interpolation of the values thus read, and writing into the memory cell which has triggered the error.

Additional methods for recovering erroneous memory contents, not described here in detail, are denoted collectively as step S8. In one alternative design of the system in which parity circuit 8 is replaced by an error correction coding and decoding circuit and the SRAM stores multiple bits of a suitable correction code for each data word, an erroneous data value may also be recovered by use of the error correction code.

As may be inferred from the preceding discussion, in step S2 the timer is specifically found to be set when the method of FIG. 2 has been carried out once in the recent past. If the time period in which the timer remains set is selected to be fairly short, the probability that two successive parity errors are radiation-induced may be made arbitrarily low. Thus, when a parity error is detected with the timer set, it may be assumed that the reason is a failure of the supply voltage. In this case the method skips from step S2 to step S9. In this step the contents of SRAM 2 are completely discarded, and at least a portion of the contents thereof is replaced by a set of standard values by copying same from ROM 3 to SRAM 2. Other variables which are frequently redetermined during normal operation on the basis of detection results of the sensors are likewise rewritten in step 10, using updated detection results. Thus, after steps S9, S10 are carried out the complete contents of SRAM 2 containing values free of parity errors are available which, although they are not necessarily identical bit for bit to the values stored before the error occurred, they allow at least a usable control of the machine 4.

To minimize the effects of a power failure and recovery of the contents of SRAM 2 via steps S9, S30 on the quality of control, in one refinement of the present invention ROM 3 is electrically programmable. Such an EEPROM may have significantly longer write access times than SRAM 2; however, it is also less sensitive than SRAM to radiation-induced bit flips. For such a control unit, a characteristic curve which is stored in SRAM 2 during operation and which over time is optimized specifically for the controlled machine 4 is rewritten into the EEPROM each time the machine 4 is switched off, and when the machine is restarted the characteristic curve is recopied into SRAM 2. Thus, the characteristic curve, which is recopied into SRAM 2 after a power failure is detected in step S9, is always up to date as of the particular time of the immediately preceding startup. If desired, of course, the characteristic curve may be saved in the EEPROM from time to time with the machine switched on.

The method of FIG. 2 may be simplified by completely rewriting the contents of SRAM 2 upon each occurrence of a parity error, regardless of whether it is an isolated occurrence or results from a previous error, as described with reference to steps S9 and S10.

What is claimed is:

1. A method for detecting a power failure supplied to a volatile data memory, the volatile data memory containing memory cells, each of the memory cells including an associated parity bit, the method comprising:
   reading a memory cell and associated parity bit when the memory cell is read-accessed;
   deciding, based on the parity bit, whether the memory cell is corrupted; and
   identifying a power failure when at least two read memory cells within a predefined number of successive read accesses are found to be corrupted,
   wherein the reading processes are not performed specifically for the purpose of identifying errors or failures,
   wherein the reading process is performed within a scope of carrying out a task that is different from the detecting of a power failure, and processing of the task is not delayed by the detecting, and
   wherein the predefined number are chosen such that a likelihood of at least two radiation-induced corruptions of the data units is substantially low.

2. The method as recited in claim 1, wherein a memory cell found to be corrupted is corrected based on the parity bit when the finding does not result in identification of a power failure.

3. The method as recited in claim 1, further comprising:
   in response to the identifying the power failure;
   discarding data stored in the memory cells from at least a portion of the volatile data memory; and
   recovering the memory cells from a source outside the volatile memory.

4. The method as recited in claim 3, wherein the memory cells are recovered, at least in part, by recomputation based on measured data.

5. The method as recited in claim 3, wherein the memory cells are recovered, at least in part, by transferal from a nonvolatile memory.

6. The method as recited in claim 3, wherein memory cells which have not been found to be corrupted are also recovered.

7. The method as recited in claim 3, wherein a memory cell found to be corrupted is corrected based on the parity bit when the finding does not result in identification of a power failure.

8. The method as recited in claim 3, wherein the memory cells are recovered, at least in part, by at least one of (i) recomputation based on measured data, and (ii) at least in part, by transferal from a nonvolatile memory, and wherein memory cells which have not been found to be corrupted are also recovered.

9. The method as recited in claim 8, wherein a memory cell found to be corrupted is corrected based on the parity bit when the finding does not result in identification of a power failure.

10. The method as recited in claim 1, wherein a memory cell found to be corrupted is corrected based on the parity bit when the finding does not result in identification of a power failure.

* * * * *